(12) United States Patent
Park et al.

(10) Patent No.: US 8,008,787 B2
(45) Date of Patent: Aug. 30, 2011

(54) INTEGRATED CIRCUIT PACKAGE SYSTEM WITH DELAMINATION PREVENTION STRUCTURE

(75) Inventors: DongSam Park, Ichon-si (KR); A Leam Choi, Guri-si (KR); Keon Teak Kang, Namyangju-si (KR)

(73) Assignee: Stats Chippac Ltd., Singapore (SG)

( * ) Notice: Subject to any disclaimer, the term of this patent is extended or adjusted under 35 U.S.C. 154(b) by 465 days.

(21) Appl. No.: 11/857,206

(22) Filed: Sep. 18, 2007

(65) Prior Publication Data

US 2009/0072377 A1 Mar. 19, 2009

(51) Int. Cl.
*H01L 23/48* (2006.01)
*H01L 23/52* (2006.01)

(52) U.S. Cl. . 257/787; 257/784; 257/790; 257/E23.126; 438/127; 438/617

(58) Field of Classification Search ............... 257/787, 257/790, E23.126, 784
See application file for complete search history.

(56) References Cited

U.S. PATENT DOCUMENTS

| | | | |
|---|---|---|---|
| 4,910,581 A | 3/1990 | Baird | |
| 5,309,026 A * | 5/1994 | Matsumoto | 257/787 |
| 5,313,102 A * | 5/1994 | Lim et al. | 257/787 |
| 5,604,376 A * | 2/1997 | Hamburgen et al. | 257/676 |
| 5,729,050 A * | 3/1998 | Kim | 257/667 |
| 5,796,586 A | 8/1998 | Lee et al. | |
| 6,191,360 B1 | 2/2001 | Tao et al. | |
| 6,707,167 B2 * | 3/2004 | Huang et al. | 257/790 |
| 6,906,414 B2 * | 6/2005 | Zhao et al. | 257/707 |
| 7,190,071 B2 | 3/2007 | Shin et al. | |
| 7,202,559 B2 * | 4/2007 | Zhao et al. | 257/707 |
| 7,259,455 B2 * | 8/2007 | Seto | 257/700 |
| 2002/0145207 A1 * | 10/2002 | Anderson et al. | 257/787 |
| 2003/0034569 A1 * | 2/2003 | Caletka et al. | 257/796 |
| 2003/0222344 A1 * | 12/2003 | Hosoyamada et al. | 257/738 |
| 2007/0045876 A1 * | 3/2007 | Onodera et al. | 257/790 |
| 2007/0158801 A1 | 7/2007 | Lee et al. | |

* cited by examiner

*Primary Examiner* — Nitin Parekh
(74) *Attorney, Agent, or Firm* — Mikio Ishimaru

(57) ABSTRACT

An integrated circuit package system includes: mounting an integrated circuit die over a carrier; attaching a delamination prevention structure over the integrated circuit die; and encapsulating the delamination prevention structure and the integrated circuit die.

18 Claims, 3 Drawing Sheets

INTEGRATED CIRCUIT PACKAGE SYSTEM WITH DELAMINATION PREVENTION STRUCTURE

TECHNICAL FIELD

The present invention relates generally to an integrated circuit package system and more particularly to an integrated circuit package system having a recess in the encapsulation.

BACKGROUND ART

The advent of integrated circuitry has given rise to the need for integrated circuit packages that will both house and protect the integrated circuit die. These integrated circuit packages provide a mechanism for making electrical interconnection between the circuits on the integrated circuit die and the leads that are utilized to make electrical interconnections to circuits, power, and ground external to the integrated circuit die. In the early stages of development of integrated circuits, there were relatively few connections between the integrated circuit die and the external circuitry.

As integrated circuit packages provide electrical interconnection of integrated circuits to an electronic system at a next level of integration or hierarchy, a substrate or a carrier is one common means of electrical interconnection. Across virtually all applications, there continues to be growing demand for reducing size and increasing performance of integrated circuits.

Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to reduce the size of the packaged integrated circuits. To meet these needs, packaging technologies are increasingly using smaller area designs with smaller features.

As the integrated circuit technology advanced, more circuit cells were able to be fabricated in a similar die area so that substantially increased functionality could be accomplished on a given integrated circuit die. The added functionality and increase in the number of circuits involved generally required a larger number of discrete connections to the associated external circuitry. The integrated circuit die is connected or bonded to the substrate using thin and flexible wires or bond wires.

An integrated circuit package generally includes a protective housing, which surrounds the integrated circuit die. The protective housing is usually filled with a liquid potting mixture, or other encapsulant, which then hardens in situ. During the introduction of the liquid, however, the bond wires are susceptible to mid-line motion or "sweep" potentially causing bond wires to short circuit.

A variety of approaches has been put forward to minimize or eliminate the bond wire "sweep". The direction of the fill material entry ("center gating" and "side gating", for example) has been varied to minimize sweep. Some attempts, such as "side gating", with bonding patterns and systems have not provided an adequate bonding pattern to minimize shorting during fill processes. Other attempts, such as "center gating" reduces or eliminates wire "sweep" but presents other problems.

For example, the integrated circuit may be chipped or damaged by the mold gate leading to yield loss and increased cost. In another example, the "center gate" or more specifically, the top center mold gate method requires a minimum thickness at the mold gate to minimize delamination of the encapsulation. This minimum thickness constrains the reduction in the package profile.

Thus, a need still remains for an integrated circuit package system providing smaller form factor, low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: mounting an integrated circuit die over a carrier; attaching a delamination prevention structure over the integrated circuit die; and encapsulating the delamination prevention structure and the integrated circuit die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
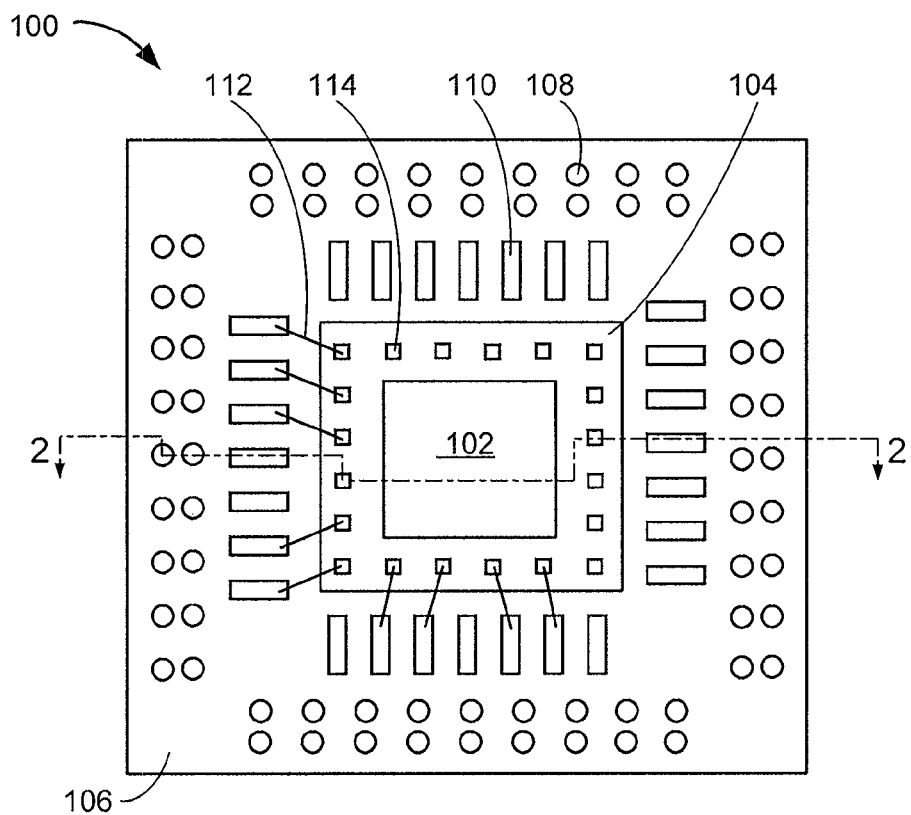
FIG. 1 is a plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown an integrated circuit package system 100 in a first embodiment of the present invention. The plan view depicts a top view of the integrated circuit package system 100 without an encapsulant. A delamination prevention structure 102, such as an adhesive film, is over an integrated circuit die 104. The integrated circuit die 104 is over a carrier 106, such as a substrate, wherein the carrier 106 includes contact pads 108 towards the periphery of the carrier 106 and terminal pads 110. The terminal pads 110 are between the contact pads 108 and the integrated circuit die 104.

Internal interconnects 112, such as bond wires or ribbon bond wires, connect the integrated circuit die 104 and the terminal pads 110. Not all the internal interconnects 112 are shown for clarity. The delamination prevention structure 102 is within the boundary of bond pads 114 of the integrated circuit die 104 and does not impede the connections of the internal interconnects 112, wherein the delamination prevention structure 102 is adjacent to the internal interconnects 112.

For illustrative purposes, the carrier 106 is shown having two rows of the contact pads 108, although it is understood that the carrier 106 may have a different number of rows of the contact pads 108, such as more be more or less than two rows that may or may not be evenly spaced. Also for illustrative purposes, the carrier 106 is shown with the terminal pads 110 in a single row configuration, although it is understood that the carrier 106 may have the terminal pads 110 in a different configuration, such as in more than one row or in unevenly spaced rows.

Figure 2:
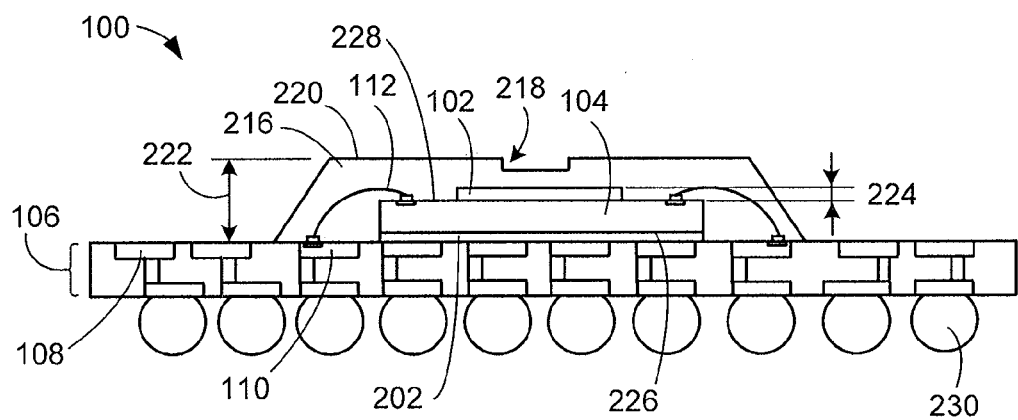
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts the integrated circuit die 104 mounted to the carrier 106 by an adhesive 202. As mentioned earlier, the internal interconnects 112 connect the integrated circuit die 104 and the terminal pads 110 exposed in the carrier 106. The delamination prevention structure 102 is over directly on the central portion of the integrated circuit die 104.

An encapsulation 216, such as an epoxy molding compound, is directly on and covers the integrated circuit die 104, the internal interconnects 112, and the delamination prevention structure 102. A recess 218 is at a central portion at a top side 220 of the encapsulation 216. The recess 218 is preferably formed during a molding process to form the encapsulation 216 with a top center gate molding method. Between the delamination prevention structure 102 and the top side 220 of the encapsulation 216, there is only the encapsulation 216.

The recess 218 is over the delamination prevention structure 102. The delamination prevention structure 102 improves adhesion between the encapsulation 216 below the recess 218 and the integrated circuit die 104. The delamination prevention structure 102 improves the reliability performance of the integrated circuit package system 100, such as in moisture resistance test (MRT). Also, the delamination prevention structure 102 also prevents gate chip out which may result in external visual inspection (EVI) rejection as well as center delamination.

The improved adhesion between the encapsulation 216 and the integrated circuit die 104 allows a reduction in a cover height 222 of the encapsulation 216 especially below the recess 218 to mitigate delamination risk. The greater uniformity in a thickness 224 of the delamination prevention structure 102 provides better adhesion thereby further reducing delamination risk.

It has been discovered that the present invention improves yield, reduces package height, and improves reliability test performance by having the delamination prevention structure between the integrated circuit die and the encapsulation. The encapsulation delamination prevention structure enhances the adhesion of the encapsulation to help prevent gate chip out and center delamination. The delamination prevention structure also reduces the encapsulation height by approximately in the range of 30 to 40 µm.

It has also been discovered that the uniformity of thickness of the delamination prevention structure over the integrated circuit die uniformly improves the adhesion between the encapsulation, the delamination prevention structure, and the integrated circuit die. The uniformity mitigates or eliminates potential weak adhesion regions that may start delamination.

The integrated circuit die 104 includes a non-active side 226 and an active side 228, wherein the active side 228 has active circuitry fabricated thereon. For illustrative purposes, the integrated circuit package system 100 is shown with the integrated circuit die 104 as a bond wire integrated circuit with the delamination prevention structure 102 over the active side 228, although it is understood that the integrated circuit package system 100 may have a different type of integrated circuit device and the delamination prevention structure 102 may attach to a different side. For example, the integrated circuit die 104 may be a flip chip (not shown) with an active side facing the carrier 106 and the delamination prevention structure 102 attach to the non-active side of the flip chip. Also for illustrative purposes, the integrated circuit package system 100 is shown with the integrated circuit die 104, although it is understood that the integrated circuit package system 100 may include multiple devices (not shown) in the encapsulation 216.

In this example, the encapsulation 216 does not cover the entire top surface of the carrier 106 exposing the contact pads 108. Other devices (not shown), such as passive components or other integrated circuit package systems, may be mounted over the carrier 106 and connected with the contact pads 108. External interconnects 230, such as solder balls, attach with and under the carrier 106.

Figure 3:
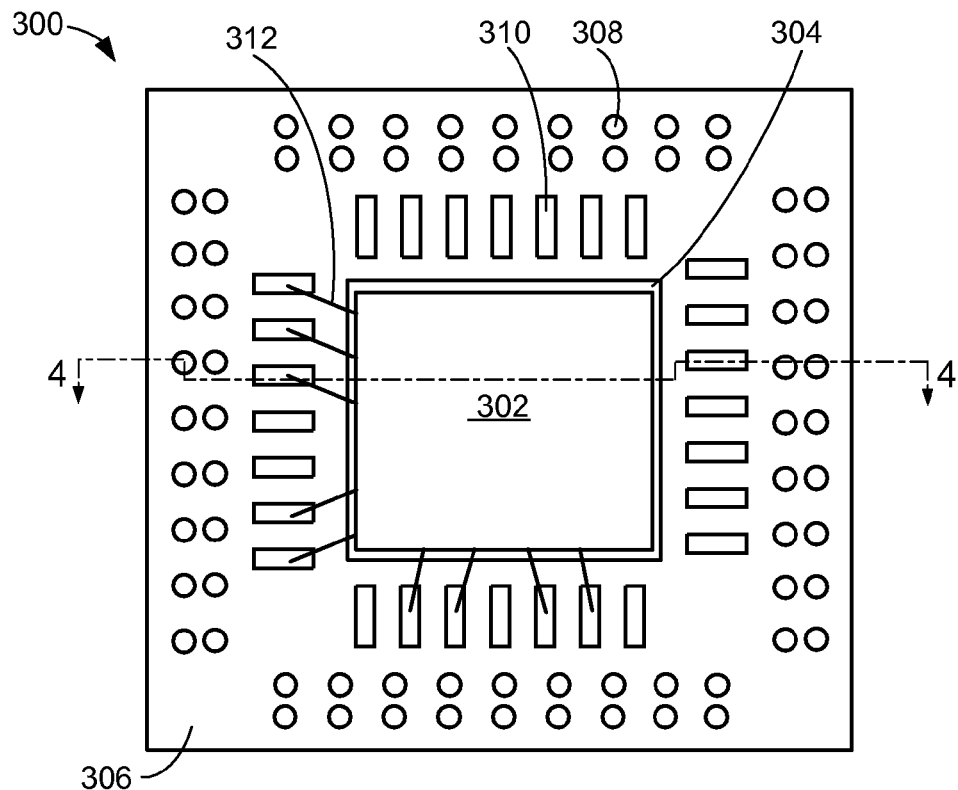
FIG. 3 is a plan view of an integrated circuit package system in a second embodiment of the present invention.

Referring now to FIG. 3, therein is shown a plan view of an integrated circuit package system 300 in a second embodiment of the present invention. The plan view depicts a top view of the integrated circuit package system 300 without an encapsulant. A delamination prevention structure 302, such as an adhesive film, is over an integrated circuit die 304. The integrated circuit die 304 is over a carrier 306, such as a substrate, wherein the carrier 306 includes contact pads 308 towards the periphery of the carrier 306 and terminal pads 310. The terminal pads 310 are between the contact pads 308 and the integrated circuit die 304.

Internal interconnects 312, such as bond wires or ribbon bond wires, connect the integrated circuit die 304 and the terminal pads 310. Not all the internal interconnects 312 are shown for clarity. The delamination prevention structure 302 is within the boundary of the integrated circuit die 304 and over the connections of the internal interconnects 312 with the integrated circuit die 304. The delamination prevention structure 302 may protect the connection of the internal interconnects 312 with the integrated circuit die 304 during the molding process.

For illustrative purposes, the carrier 306 is shown having two rows of the contact pads 308, although it is understood that the carrier 306 may have a different number of rows of the contact pads 308, such as more be more or less than two rows that may or may not be evenly spaced. Also for illustrative purposes, the carrier 306 is shown with the terminal pads 310 in a single row configuration, although it is understood that the carrier 306 may have the terminal pads 310 in a different configuration, such as in more than one row or in unevenly spaced.

Figure 4:
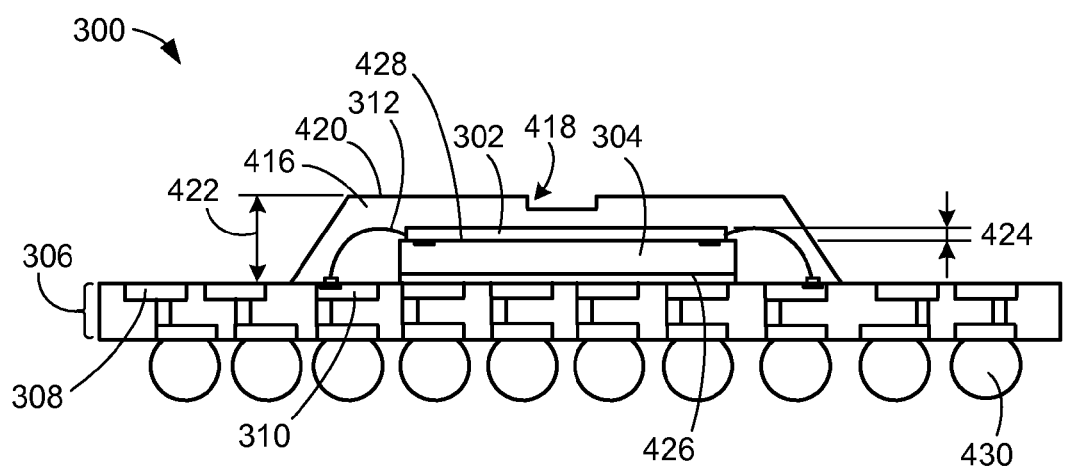
FIG. 4 is a cross-sectional view of the integrated circuit package system along line 4-4 of FIG. 3.

Referring now to FIG. 4, therein is shown a cross-sectional view of the integrated circuit package system 300 along line 4-4 of FIG. 3. The cross-sectional view depicts the integrated circuit die 304 mounted over the carrier 306. As mentioned earlier, the internal interconnects 312 connect the integrated circuit die 304 and the terminal pads 310 exposed in the carrier 306. The delamination prevention structure 302 is over the integrated circuit die 304 and the connection site of the internal interconnects 312 with the integrated circuit die 304.

An encapsulation 416, such as an epoxy molding compound, covers the integrated circuit die 304, the internal interconnects 312, and the delamination prevention structure 302. A recess 418 is at a central portion at a top side 420 of the encapsulation 416. The recess 418 is preferably during a molding process to form the encapsulation 416 with a top center gate molding method.

The recess 418 is over the delamination prevention structure 302. The delamination prevention structure 302 improves adhesion between the encapsulation 416 below the recess 418 and the integrated circuit die 304. The delamination prevention structure 302 improves the reliability performance of the integrated circuit package system 300, such as in moisture resistance test (MRT).

The improved adhesion between the encapsulation 416 and the integrated circuit die 304 allows a reduction in a cover height 422 of the encapsulation 416 compared with the thickness of the encapsulation 416 below the recess 418 to mitigate delamination risk. The greater uniformity in a thickness 424 of the delamination prevention structure 302 provides better adhesion thereby further reducing delamination risk.

The integrated circuit die 304 includes a non-active side 426 and an active side 428, wherein the active side 428 has active circuitry fabricated thereon. For illustrative purposes, the integrated circuit package system 300 is shown with the integrated circuit die 304 as a bond wire integrated circuit with the delamination prevention structure 302 over the active side 428, although it is understood that the integrated circuit package system 300 may have a different type of integrated circuit device and the delamination prevention structure 302 may attach to a different side. For example, the integrated circuit die 304 may be a flip chip (not shown) with an active side facing the carrier 306 and the delamination prevention structure 302 attach to the non-active side of the flip chip. Also for illustrative purposes, the integrated circuit package system 300 is shown with the integrated circuit die 304, although it is understood that the integrated circuit package system 300 may include multiple devices (not shown) in the encapsulation 416.

In this example, the encapsulation 416 does not cover the entire top surface of the carrier 306 exposing the contact pads 308. Other devices (not shown), such as passive components or other integrated circuit package systems, may be mounted over the carrier 306 and connected with the contact pads 308. External interconnects 430, such as solder balls, attach with and under the carrier 306.

Figure 5:
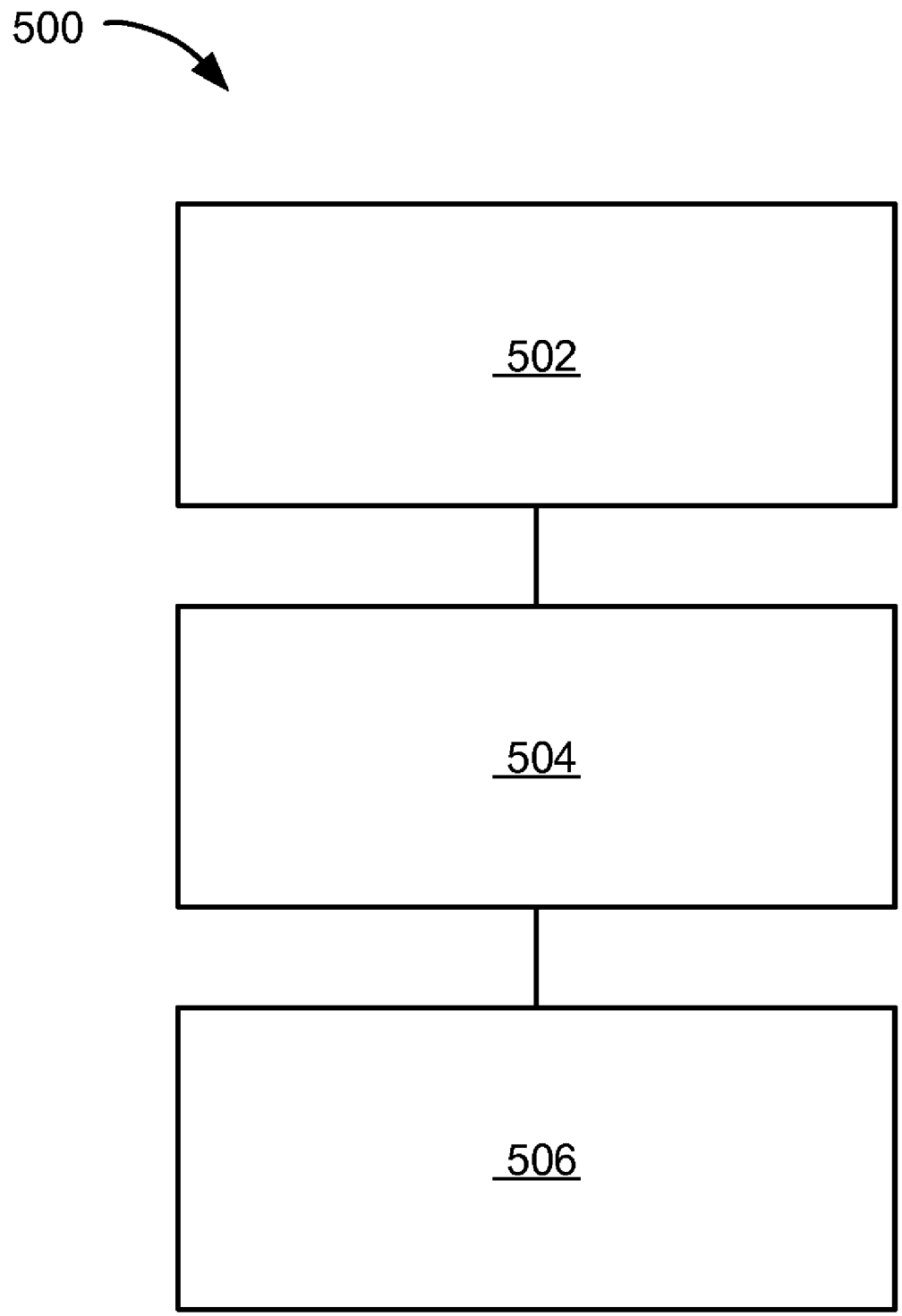
FIG. 5 is a flow chart of an integrated circuit package system for manufacturing of the integrated circuit package system in an embodiment of the present invention.

Referring now to FIG. 5, therein is shown a flow chart of an integrated circuit package system 500 for manufacturing the integrated circuit package system 100 in an embodiment of the present invention. The system 500 includes mounting an integrated circuit die over a carrier in a block 502; attaching a delamination prevention structure over the integrated circuit die in a block 504; and encapsulating the delamination prevention structure and the integrated circuit die in a block 506.

Yet another important aspect of the present invention is that it valuably supports and services the historical trend of reducing size, improving reliability, reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
    mounting an integrated circuit die to a carrier by an adhesive;
    attaching a delamination prevention structure having an uniform thickness, directly on a center of the integrated circuit die including positioning the delamination prevention structure within the boundary of the integrated circuit die; and
    encapsulating the delamination prevention structure and the integrated circuit die, with only an encapsulation between a top side of the encapsulation and the delamination prevention structure.

2. The method as claimed in claim 1 further comprising:
    connecting an internal interconnect between the integrated circuit die and the carrier; and
wherein attaching the delamination prevention structure directly on the integrated circuit die includes:
    attaching the delamination prevention structure adjacent to the internal interconnect.

3. The method as claimed in claim 1 further comprising:
connecting an internal interconnect between the integrated circuit die and the carrier; and
wherein attaching the delamination prevention structure over the integrated circuit die includes:
attaching the delamination prevention structure directly on the internal interconnect.

4. The method as claimed in claim 1 wherein encapsulating the delamination prevention structure and the integrated circuit die over the carrier includes forming the encapsulation having a recess over the integrated circuit die with the recess over the delamination prevention structure.

5. The method as claimed in claim 1 wherein attaching the delamination prevention structure over the integrated circuit die includes attaching a film adhesive over the integrated circuit die.

6. A method of manufacturing an integrated circuit package system comprising:
mounting an integrated circuit die to a carrier by an adhesive;
connecting an internal interconnect between the integrated circuit die and the carrier;
attaching a delamination prevention structure having an uniform thickness, directly on a center of the integrated circuit die including positioning the delamination prevention structure within the boundary of the integrated circuit die; and
forming an encapsulation having a recess over directly on the delamination prevention structure, the integrated circuit die, and the internal interconnect with the recess over the delamination prevention structure, with only the encapsulation between a top side of the encapsulation and the delamination prevention structure.

7. The method as claimed in claim 6 wherein forming the encapsulation having the recess over the delamination prevention structure and the integrated circuit die includes exposing a contact pad of the carrier by the encapsulation.

8. The method as claimed in claim 6 wherein attaching the delamination prevention structure directly on the integrated circuit die includes attaching the delamination prevention structure over the internal interconnect.

9. The method as claimed in claim 6 further comprising attaching an external interconnect under the carrier.

10. An integrated circuit package system comprising:
a carrier;
an integrated circuit die mounted to the carrier by an adhesive;
a delamination prevention structure having an uniform thickness, directly on a center of the integrated circuit die includes the delamination prevention structure is within the boundary of the integrated circuit die; and
an encapsulation directly on the delamination prevention structure and the integrated circuit die, with only the encapsulation between a top side of the encapsulation and the delamination prevention structure.

11. The system as claimed in claim 10 further comprising:
an internal interconnect between the integrated circuit die and the carrier; and
wherein the delamination prevention structure is adjacent to the internal interconnect.

12. The system as claimed in claim 10 further comprising:
an internal interconnect between the integrated circuit die and the carrier; and
wherein the delamination prevention structure is over the internal interconnect.

13. The system as claimed in of claim 10 wherein the encapsulation includes a recess over the delamination prevention structure.

14. The system as claimed in claim 10 wherein the delamination prevention structure includes a film adhesive.

15. The system as claimed in claim 10 further comprising:
an internal interconnect between the integrated circuit die and the carrier; and wherein the encapsulation includes a recess over the delamination prevention structure.

16. The system as claimed in claim 15 wherein the carrier includes a contact pad exposed by the encapsulation.

17. The system as claimed in of claim 15 wherein the delamination prevention structure is over the internal interconnect.

18. The system as claimed in claim 15 further comprising an external interconnect under the carrier.

* * * * *

UNITED STATES PATENT AND TRADEMARK OFFICE
CERTIFICATE OF CORRECTION

| | | |
|---|---|---|
| PATENT NO. | : 8,008,787 B2 | Page 1 of 1 |
| APPLICATION NO. | : 11/857206 | |
| DATED | : August 30, 2011 | |
| INVENTOR(S) | : Park et al. | |

It is certified that error appears in the above-identified patent and that said Letters Patent is hereby corrected as shown below:

Column 3:
line 56, delete "is over directly" and insert therefor --is directly--

Column 7:
claim 6, line 28, delete "recess over directly" and insert therefor --recess directly--

Signed and Sealed this
Tenth Day of April, 2012

David J. Kappos
*Director of the United States Patent and Trademark Office*